United States Patent
Yasunaga et al.

(10) Patent No.: US 7,414,394 B2
(45) Date of Patent: Aug. 19, 2008

(54) METHOD OF QUALITY-TESTING A SHIELD FILM OF A MAGNETORESISTIVE EFFECT HEAD

(75) Inventors: Masahiro Yasunaga, Kawasaki (JP); Takuji Furutani, Kawasaki (JP); Hiroshi Maeda, Kawasaki (JP); Minoru Sawada, Kawasaki (JP); Kiyotsune Yoshimatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/515,713

(22) Filed: Sep. 6, 2006

(65) Prior Publication Data
US 2007/0273370 A1 Nov. 29, 2007

(30) Foreign Application Priority Data
May 25, 2006 (JP) .............................. 2006-145606

(51) Int. Cl.
G01R 33/12 (2006.01)
(52) U.S. Cl. ..................................................... 324/210
(58) Field of Classification Search .......... 324/210–212
See application file for complete search history.

(56) References Cited

U.S. PATENT DOCUMENTS 6,090,498 A * 7/2000 Omata et al. ............. 428/811.2
6,340,885 B1 * 1/2002 Hachisuka et al. .......... 324/210
6,433,540 B1 * 8/2002 Hachisuka et al. .......... 324/210
6,714,006 B2 * 3/2004 Mackay et al. ............. 324/210
7,193,824 B2 * 3/2007 Naka ....................... 360/324.2
2008/0061773 A1 * 3/2008 Otagiri et al. ............... 324/210

FOREIGN PATENT DOCUMENTS

JP 10-124828 5/1998

* cited by examiner

*Primary Examiner*—Jay M Patidar
(74) *Attorney, Agent, or Firm*—Kratz, Quintos & Hanson, LLP

(57) ABSTRACT

When testing the quality of shield films of magnetoresistive effect heads, a method of testing and a testing apparatus can detect heads where the shield magnetic domain is susceptible to changing that could not be completely detected by conventional methods of testing that use normal magnetization. The method of testing applies an external magnetic field to a magnetoresistive effect head as external stress, measures the output voltage of the head, and repeats the applying of the external magnetic field and the measuring a plurality of times to test the quality of the shield film. The magnetic field is applied in a direction parallel to the shield film and at an angle to a floating surface of the magnetoresistive effect head. The intensity of the applied magnetic field is smaller than the coercive force of a hard bias film and larger than the coercive force of the shield film.

4 Claims, 6 Drawing Sheets

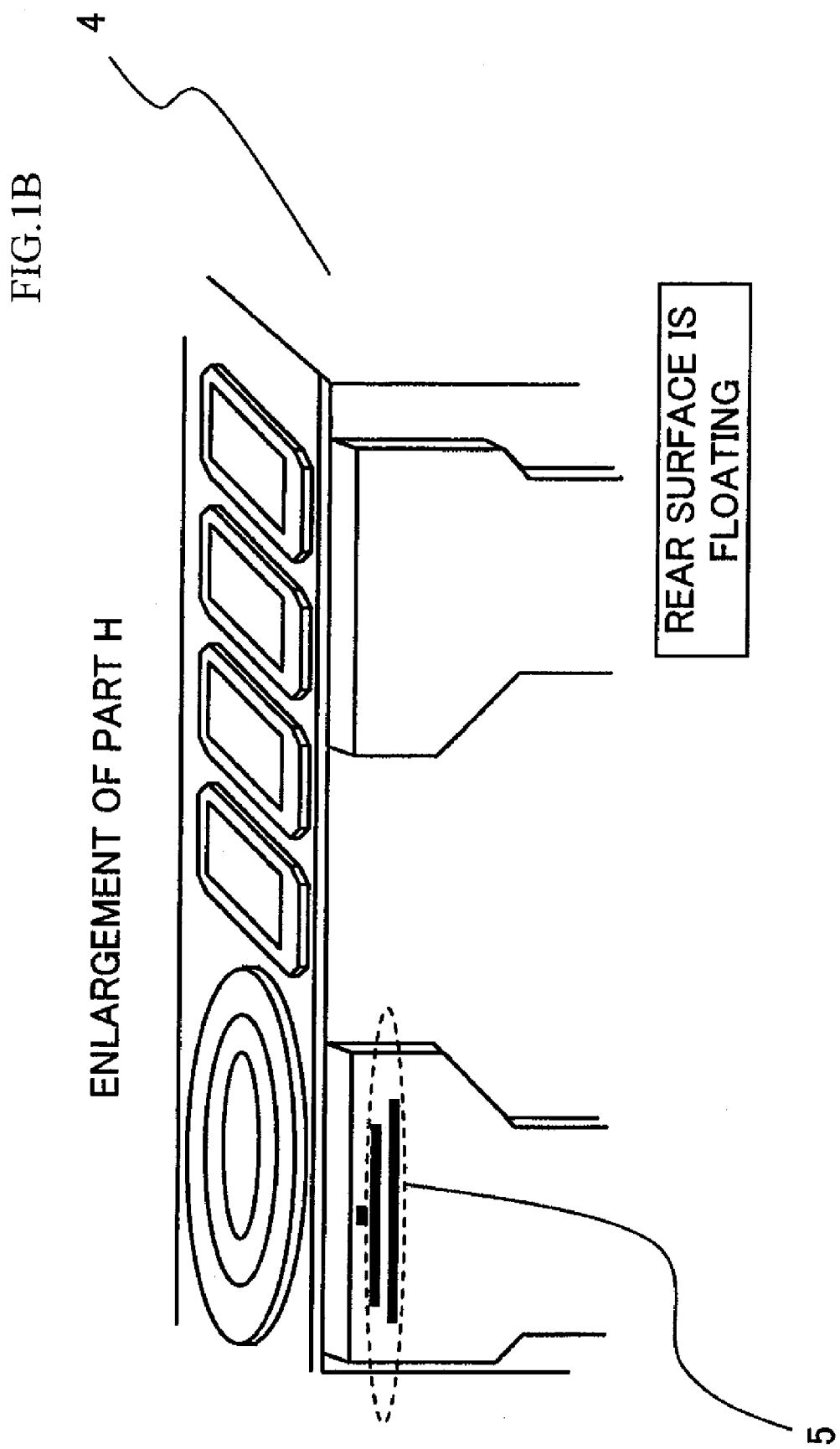

SAMPLE a
PARALLEL MAGNETIZATION

SAMPLE a
MINUTE ANGLE MAGNETIZATION

SAMPLE b
PARALLEL MAGNETIZATION

SAMPLE b
MINUTE ANGLE MAGNETIZATION

METHOD OF QUALITY-TESTING A SHIELD FILM OF A MAGNETORESISTIVE EFFECT HEAD

BACKGROUND OF THE INVENTION

1. Field of the Invention

The present invention relates to a method of testing and a testing apparatus for a magnetoresistive effect head, and in more detail to a method and testing apparatus that apply an external magnetic field to (hereinafter, simply "magnetize") a magnetoresistive effect head as external stress and then measure the output voltage of the magnetoresistive effect head and repeat such magnetizing and measuring a plurality of times to test the quality of the shield film of the magnetoresistive effect head.

2. Related Art

In recent years, magnetoresistive effect heads that use a magnetoresistive effect, as represented by so-called "MR heads", have been commercialized as thin-film magnetic heads for use with magnetic media such as magnetic disks.

However, although MR heads use the magnetoresistive effect of a magnetic thin film and can obtain a large reproduction output without being dependent on the relative velocity of the head to the magnetic medium, there is a problem that defective MR heads are produced where the magnetic domain of a shield film, i.e., a magnetic layer disposed on both sides of the MR element, can be changed by an external magnetic field, resulting in variation in the output of the MR head.

Since MR heads where the output may vary cannot be expected to carry out reproduction operations properly, such heads need to be rejected during the tests carried out as part of the manufacturing process.

However, since it has not been possible to quantitatively ascertain which MR heads have unstable characteristics where the magnetic domain of the shield film (hereinafter, simply "shield magnetic domain") changes, the method of testing MR heads has been problematic.

The following method has been used as a conventional method of testing a MR head. An operation that applies a magnetic field in a direction that is parallel to the shield film of the MR head and makes an angle of 0° to a float surface of a magnetoresistive effect head (hereinafter this is referred to as "normal magnetization") and measures the output voltage of the MR head is repeatedly carried out and the difference between the highest and lowest output voltages is calculated as the variation and used to evaluate how the output varies.

However, the above method has had a problem in that it is not possible to completely detect MR heads where the shield magnetic domain is susceptible to changing.

The inventors of the present invention found that by implementing a method of testing the quality of the shield film of the magnetoresistive effect head composed of a procedure of repeatedly carrying out an operation where an external magnetic field that is parallel to the shield film of the magnetoresistive effect head but makes an extremely small angle to the float surface is applied (hereinafter such operation is referred to as "minute angle magnetization") and the output voltage of the magnetoresistive effect head is then measured, it becomes possible to detect magnetoresistive effect heads where the shield magnetic domain is susceptible to changing that could not be detected by the conventional method of testing via normal magnetization (see FIGS. 4A to 4D).

The present invention uses this principle and by setting the minute angle and the intensity of the applied magnetic field in appropriate ranges provides a favorable testing apparatus and method of testing a magnetoresistive effect head.

One example of a method of testing a magnetoresistive effect head is disclosed by Japanese Laid-Open Patent Publication No. H10-124828 and is shown in FIG. 6.

This reference proposes a method where a magnetic field is applied as stress in an inclined direction to MR stripes and the characteristics of the MR heads are measured.

Due to the MR heads being formed on a wafer with a large diameter (for example, 5 to 6 inches), the direction of magnetization of the MR stripes is susceptible to becoming non-uniform between central peripheries and outer peripheries of the heads and the magnetic domain control film described above is also susceptible to becoming non-uniform. For this reason, the problem to be solved by Japanese Laid-Open Patent Publication No. H10-124828 is to test such non-uniformities.

In this way, such object differs to the object of the present invention which is "to detect magnetoresistive effect heads where the shield magnetic domain is susceptible to changing that could not be detected by testing methods that use normal magnetization".

Patent Document 1

Japanese Laid-Open Patent Publication No. H10-124828

SUMMARY OF THE INVENTION

The present invention was conceived in view of the situation described above and it is an object of the present invention to provide a method of testing and a testing apparatus that test the quality of a shield film of a magnetoresistive effect head and can detect MR heads where the shield magnetic domain is susceptible to changing that could not be completely detected by a conventional method of testing that uses normal magnetization.

To achieve the stated object, a method of testing according to the present invention applies an external magnetic field to a magnetoresistive effect head as external stress, measures the output voltage of the magnetoresistive effect head, and repeats the applying of the external magnetic field and the measuring a plurality of times to test the quality of a shield film of the magnetoresistive effect head, wherein the magnetic field is applied in a direction parallel to the shield film of the magnetoresistive effect head and at an angle to a floating surface of the magnetoresistive effect head, and the intensity of the applied magnetic field is lower than the coercive force of a hard bias film and higher than the coercive force of the shield film.

By doing so, even when testing a magnetoresistive effect head that could be mistakenly determined to be non-defective by a conventional method of testing that uses normal magnification but where the shield magnetic domain is actually susceptible to changing, by repeatedly applying a magnetic field at a minute angle and measuring the output voltage of the head, the variation in the output voltage will increase, making it possible to detect the magnetoresistive effect head as a defective product.

The angle may be in a range of 5 to 10°, inclusive.

When the angle θ is in a range of 5 to 10°, inclusive, the variation in the output voltage of the tested heads critically increases, and therefore by carrying out magnetization with the stated angle range, the method of testing according to the present invention can favorably detect MR heads where the shield magnetic domain is susceptible to changing as defective products.

The intensity of the external magnetic field may be in a range of 1500 to 5000, inclusive.

When the intensity of the external magnetic field is in a range of 1500 to 5000 gauss, inclusive, the variation in the output voltage of the tested heads critically increases, and therefore by carrying out magnetization with the stated range for the intensity of the magnetic field, the method of testing according to the present invention can favorably detect MR heads where the shield magnetic domain is susceptible to changing as defective products.

A testing apparatus according to the present invention is capable of implementing the method of testing according to the present invention and includes: a power supply unit for supplying the magnetoresistive effect head with the testing current; a magnetic field generating unit for applying an external magnetic field to the magnetoresistive effect head; a measuring unit for measuring the output voltage when the external magnetic field is applied to the magnetoresistive effect head, and an angle measuring unit for disposing the magnetoresistive effect head at an angle to a direction in which the external magnetic field is applied.

By using this testing apparatus, it is possible to implement the method of testing according to the present invention and therefore possible to detect even magnetoresistive effect heads that could be mistakenly determined to be non-defective but where the shield magnetic domain is actually susceptible to changing as defective products.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings:

FIGS. 1A and 1B are schematic diagrams useful in explaining the method of testing according to an embodiment of the present invention;

DESCRIPTION OF THE PREFERRED EMBODIMENTS

A preferred embodiment of the present invention will now be described in detail with reference to the attached drawings for an example where samples on a row bar that has been cut out from a wafer are tested.

Figure 1A:
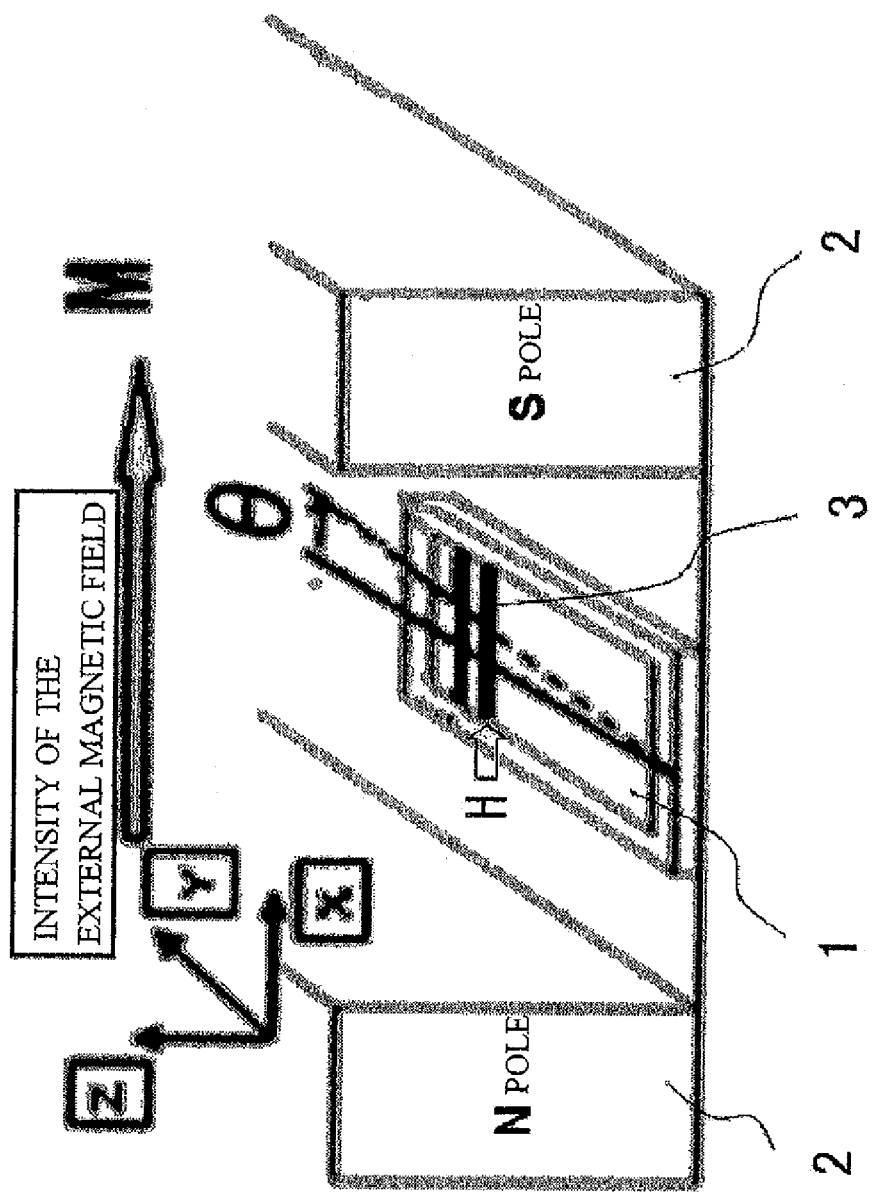
Figure 2:
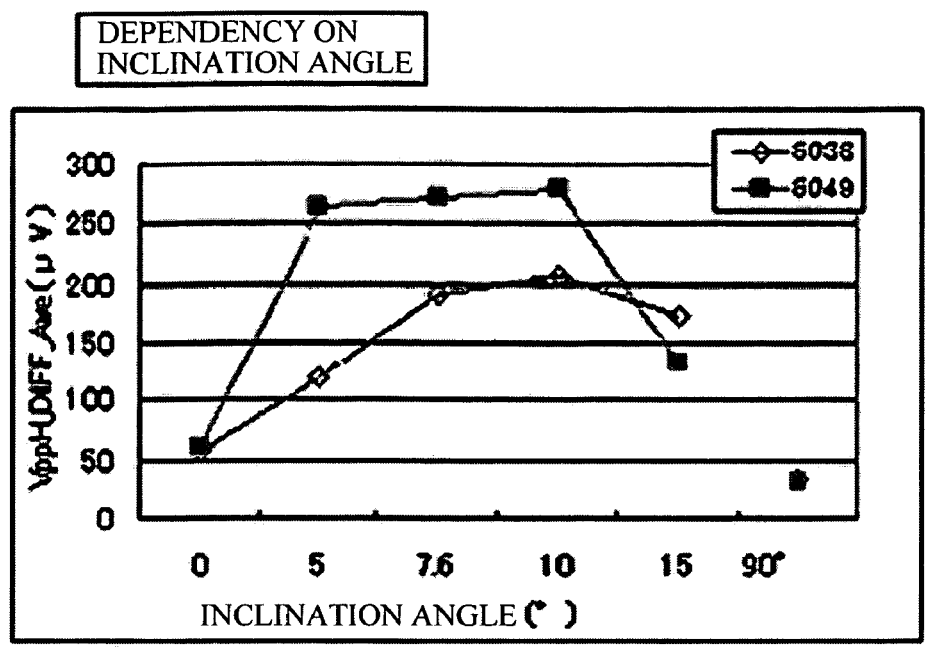
FIG. 2 is a characteristics graph showing the relationship between a minute angle θ and variation in the output voltages of tested heads.
Figure 3:
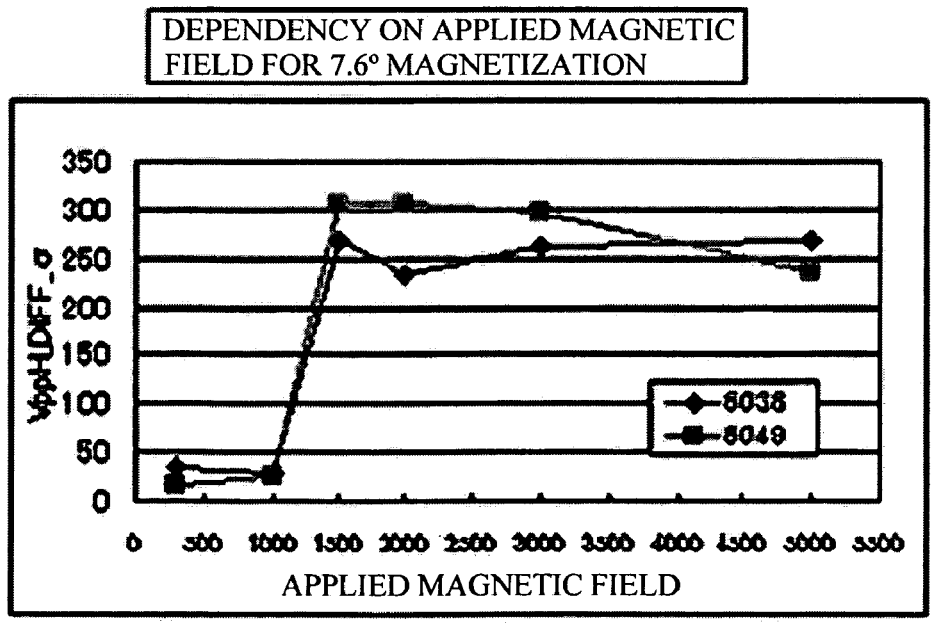
FIG. 3 is a characteristics graph showing the relationship between the intensity M of an external magnetic field and the variation in the output voltages of the tested heads.
Figure 5:
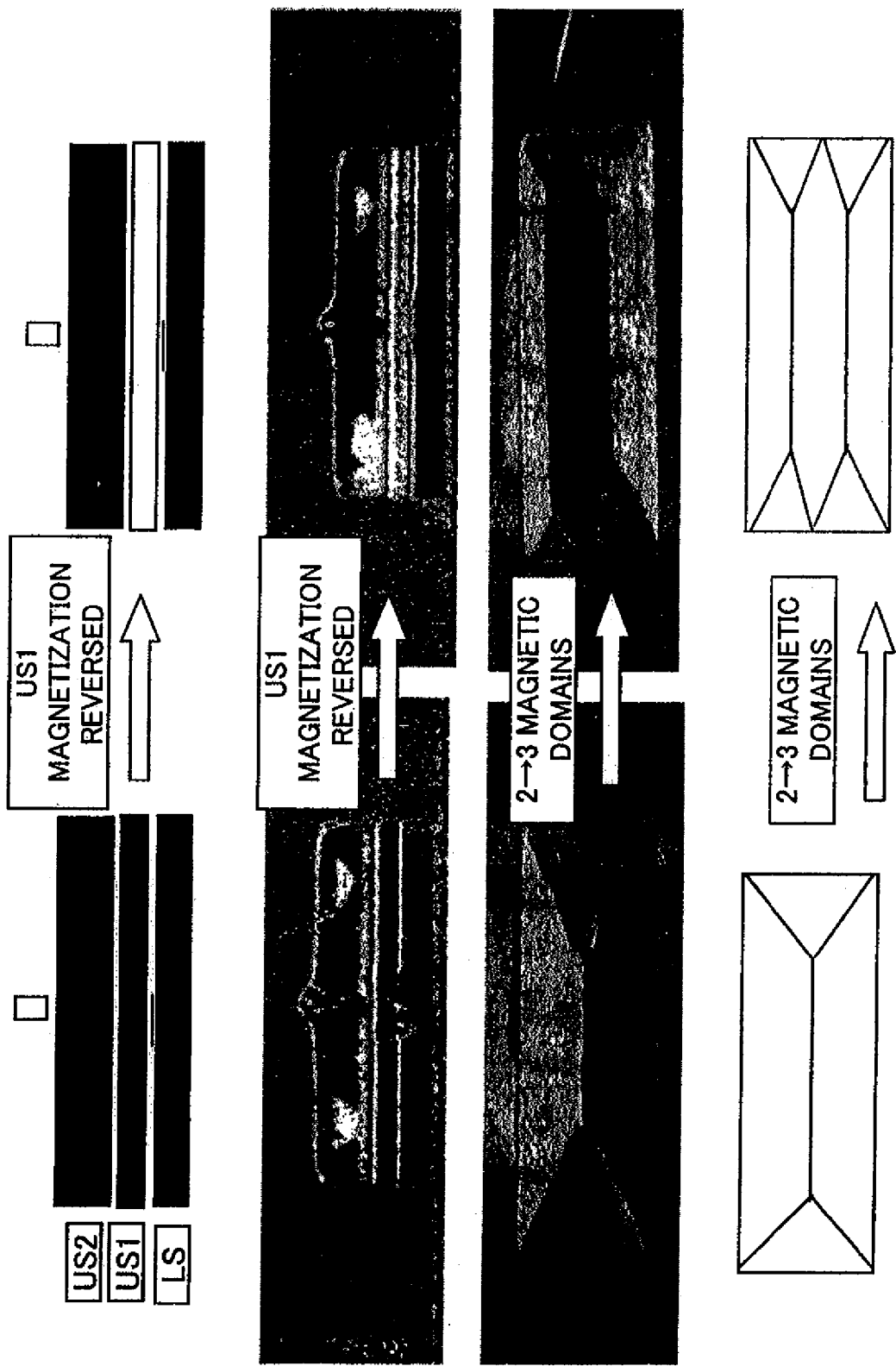
FIG. 5 is a view showing one example of tested heads where the shield magnetic domain has changed due to magnetization.
Figure 6:
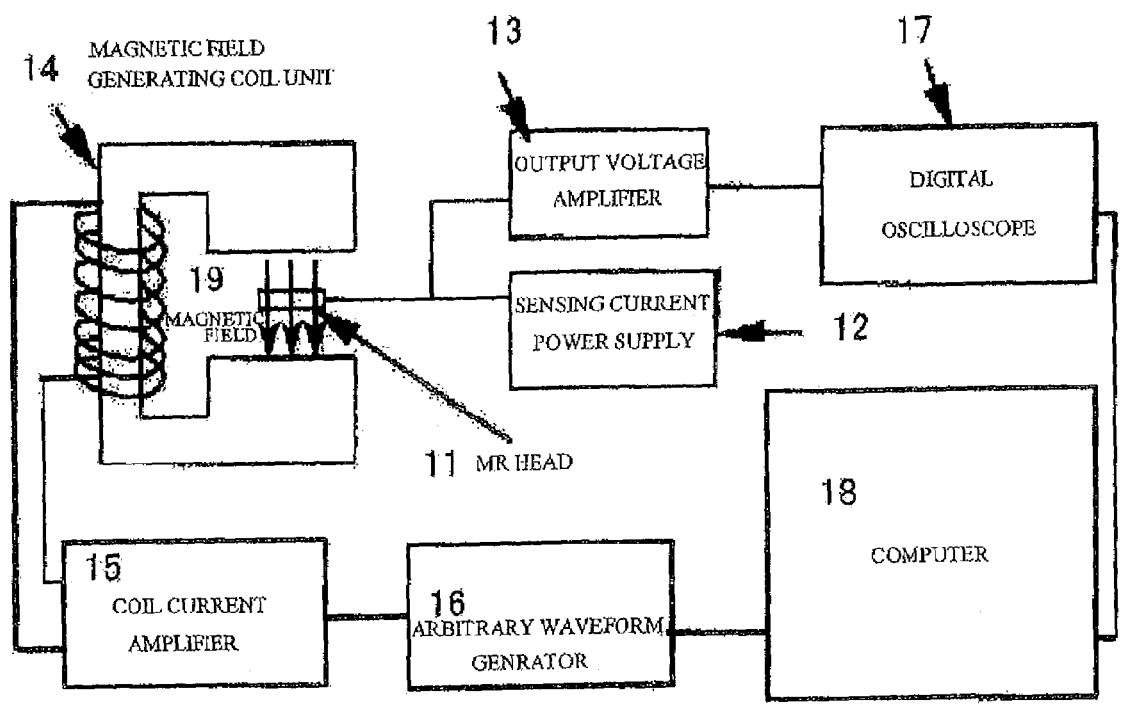
FIG. 6 is a schematic diagram showing one example of a conventional testing method.

FIGS. 1A and 1B are schematic diagrams useful in explaining the method of testing according to the present embodiment of the invention. FIG. 2 is a characteristics graph showing the relationship between the minute angle θ and the variation in the output voltages of tested heads 1. FIG. 3 is a characteristics graph showing the relationship between the intensity M of the external magnetic field and the variation in the output voltages of the tested heads 1. FIG. 4A to FIG. 4D are measurement graphs showing output voltage variations where the magnetization angles of two types of tested heads are respectively changed. FIG. 5 is a view showing one example of the tested heads 1 where the shield magnetic domain has changed due to magnetization. FIG. 6 is a schematic diagram showing one example of a conventional testing method.

The construction of a testing apparatus for implementing the testing method according to the present invention will now be described.

In FIG. 1A, reference numeral 1 designates tested heads that are formed on a row bar with a plurality of magnetoresistive effect heads 3 disposed with their lengthwise directions. Reference numeral 2 designates an external magnetic field applying coil unit for applying an external magnetic field as external stress to the tested heads 1. The testing apparatus is also equipped with a power supply unit (not shown) for generating a current (hereinafter referred to as the "sensing current") for testing the tested heads 1, a measuring unit (not shown) for measuring the output voltages of the tested heads 1, and an angle measuring unit for disposing the floating surfaces 4 of the tested heads 1 at an angle to the direction in which the external magnetic field is applied.

FIG. 1B is an enlargement of a magnetoresistive effect head part (the part H) in FIG. 1A. The rear surface shown in FIG. 1B is the floating surface 4 of a magnetoresistive effect head.

Next, the procedure of the method of testing according to the present invention will be described.

First, the tested heads 1 are set within the external magnetic field applying coil unit 2. When doing so, as shown in FIG. 1A, the tested heads 1 are set so that the direction in which the external magnetic field is applied is parallel to shield films 5 of the tested heads 1 and makes a minute angle θ with respect to the floating surfaces 4 of the tested heads 1.

Next, after the tested heads 1 have been magnetized by the external magnetic field applying coil unit 2, the output voltages outputted from the tested heads 1 are measured using the sensing current. The method of testing according to the present invention is carried out by repeatedly magnetizing and measuring the voltages.

As one example, the magnetization operation and measurement of output voltage are carried out three times for the tested heads 1, and then the direction of the sensing current is reversed and the output voltages from the tested heads 1 are measured again.

When doing so, the difference between the highest value and lowest value in the output voltage data from the measured tested heads 1 is calculated as the "variation".

In both the conventional method of testing and the method of testing according to the present invention, by investigating the characteristics of this variation, it is possible to distinguish whether the tested heads 1 are defective or non-defective.

FIGS. 4A to 4D show a comparison between the conventional method of testing that carries out normal magnetization and the method of testing according to the present invention that carries out minute-angle magnetization.

Figure 4A:
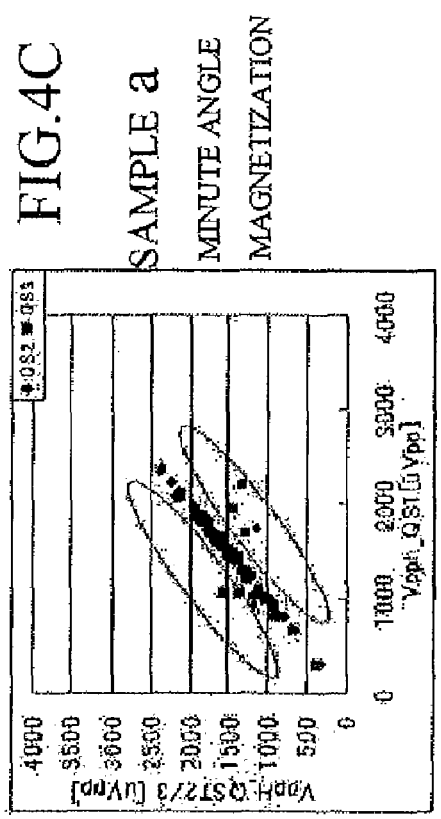
FIG. 4A to FIG. 4D are measurement graphs showing variations in output voltage where the magnetization angles of two types of tested heads are respectively changed.
Figure 4C:
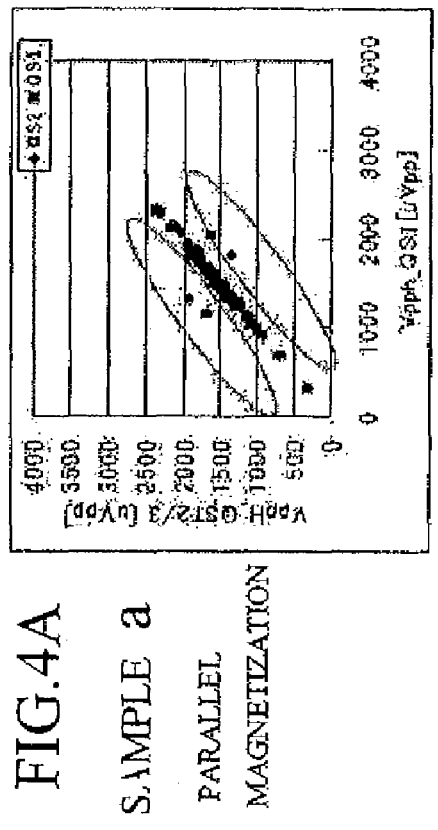

FIG. 4A shows output voltage measurements for one sample (referred to as "sample a") using normal magnetization (where the magnetization angle θ=0°), while FIG. 4C shows output voltage measurements for sample a using minute-angle magnetization (where the magnetization angle θ=7.6°).

Figure 4B:
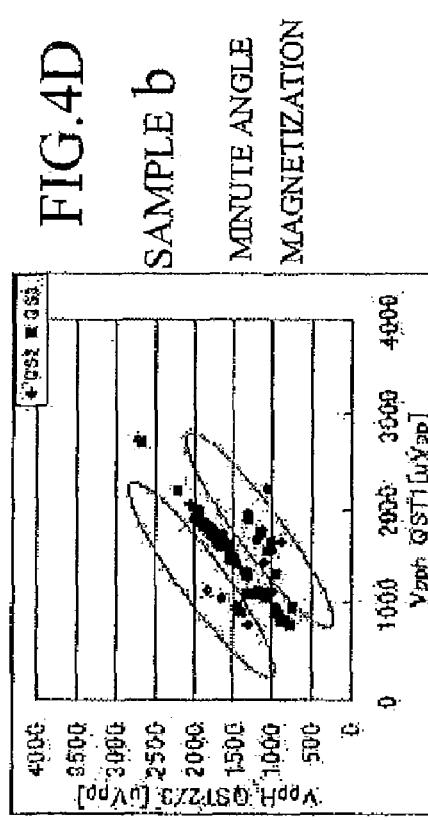
Figure 4D:
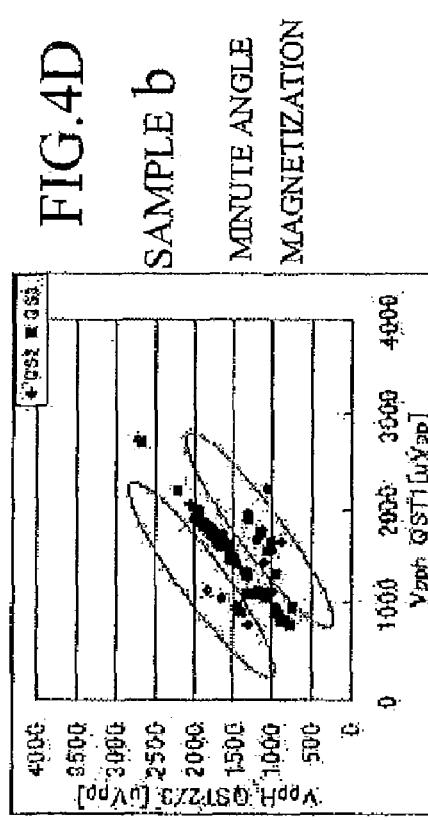

On the other hand, FIG. 4B shows output voltage measurements for another sample (referred to as "sample b") using normal magnetization (where the magnetization angle θ=0°), while FIG. 4D shows output voltage measurements for sample b using minute-angle magnetization (where the magnetization angle θ=7.6°).

In all of these graphs, the horizontal axis represents the output voltage (expressed in μV) from the tested heads 1 after magnetization has been carried out once, while the vertical axis represents the output voltages (expressed in μV) from the tested heads 1 after magnetization has been carried out twice and after magnetization has been carried out three times.

As the standard for judging whether the tested heads 1 are defective or non-defective, as one example, the tested heads 1 are judged to be non-defective when there is no variation in the output voltage outputted from the tested heads 1 between the plurality of measurements, as in the case shown in FIG. 4B.

On the other hand, as shown in FIGS. 4A, 4C, and 4D, when the variations are plotted in the ranges that have been circled by ovals, that is, when there are large variations in the output voltages from the tested heads 1 among the plurality of measurements, the tested heads 1 are identified as defective products where the shield magnetic domain is susceptible to changing.

Here, for the sample a shown in FIGS. 4A and 4C, the tested heads 1 whose variations are plotted in the circled ranges by the conventional method of testing that uses normal magnetization (see FIG. 4A) can be distinguished as defective products even if the method of testing according to the present invention is not implemented, and therefore the testing of such heads is not problematic.

However, the sample b shown in FIGS. 4B and 4D includes defective heads where the variations are not plotted in the circled ranges by the conventional method of testing that uses normal magnetization (see FIG. 4B). This means such products may be mistakenly determined to be non-defective. If such tested heads 1 are tested using the method of testing according to the present invention that carries out magnetization at a minute angle, the variations will be plotted in the regions circled by the ovals (see FIG. 4D). This means that the tested heads 1 can be determined to be defective products where the shield magnetic domain is susceptible to changing, and can be rejected.

Next, the minute angle used when carrying out magnetization will be described in detail.

FIG. 2 shows one example of the variation in the output voltage of the tested heads 1 (number of samples=2) when the external magnetic field described above is applied with the minute angle θ described above being changed in a range of 0 to 90°.

In FIG. 2, the horizontal axis shows the angle θ (expressed in degrees) and the vertical axis shows the variation (the difference between the highest output voltage and the lowest output voltage) in the output voltage (expressed in μV) of the tested heads 1 when the magnetization operation and measurement of output voltage are repeated three times on the tested heads 1 and then the sensing current is reversed and the output voltage from the tested heads 1 is measured again.

As shown in FIG. 2, when the angle θ is in a range of 5 to 10°, inclusive, the variation in the output voltage of the tested heads 1 critically increases.

By using these characteristics, even with tested heads 1 which have been determined to be non-defective since no variation in output voltage was detected when testing using normal magnetization, by setting the tested heads 1 in a testing apparatus at a minute angle where θ=5 to 10°, measuring the output voltage of the tested heads 1 using the sensing current after the external magnetic field has been applied to the tested heads 1, and repeating the applying and measuring operations a plurality of times, the characteristic whereby the shield magnetic domain is susceptible to changing can be made more apparent and the variation in the output voltage can be increased, thereby making it possible to detect tested heads that are defective.

FIG. 3 shows one example of how the output voltage of the tested heads 1 (number of samples=2) vary when the intensity of the applied external magnetic field is changed from 0 gauss to 5000 gauss. Note that this data is for the case where the minute angle θ described above is 7.6°.

In FIG. 3, the horizontal axis shows the intensity M (in gauss) of the applied external magnetic field and the vertical axis shows the variation (the difference between the highest output voltage and the lowest output voltage) in the output voltage (expressed in μV) of the tested heads 1 when the magnetization operation and measurement of output voltage are repeated three times on the tested heads 1 and then the sensing current is reversed and the output voltage from the tested heads 1 is measured again.

As shown in FIG. 3, when the intensity M of the magnetic field is in a range of 1500 gauss (≈119 kA/m) to 5000 gauss (≈398 kA/m), inclusive, the variation in the output voltage of the tested heads 1 critically increases.

By using these characteristics, even with tested heads 1 which have been determined to be non-defective since no variation in output voltage was detected when testing using normal magnetization, by setting the intensity M of the external magnetic field applied to the tested heads 1 at 5000 gauss, for example, measuring the output voltage of the tested heads 1 using the sensing current after the external magnetic field has been applied to the tested heads 1, and repeating the applying and measuring operations a plurality of times, the characteristic whereby the shield magnetic domain is susceptible to changing can be made more apparent and the variation in the output voltage can be increased, thereby making it possible to detect the tested heads that are defective.

Note that although the method of testing disclosed in Japanese Laid-Open Patent Publication No. H10-124828 indicated as prior art proposes applying an external magnetic field of 50 to 200 gauss, as shown in FIG. 3, magnetic fields of such intensity are not in the region where the variation in output voltage becomes more apparent as disclosed in this specification.

Although an example of MR heads on a row bar has been described, it is also possible to apply the method of testing and testing apparatus according to the present invention to the testing of individual MR heads that have been completed.

The method of testing and testing apparatus according to the present invention are also not limited to testing MR heads.

It was also confirmed that changes in the structure of the shield magnetic domain occur for MR heads with variations in output voltage that can be detected using the method of testing according to the present invention (see FIG. 5).

This means that the method of testing according to the present invention can also be used as a method for determining the magnetic domain structure by evaluating the output voltage of tested heads 1.

Note that the upper part of FIG. 5 shows the state of the magnetic domain of a tested head 1 when looking from the floating surface, while the lower part of FIG. 5 shows the state of the magnetic domain of a tested head 1 when looking from a direction perpendicular to the floating surface.

In this example, a magnetic field is applied as external stress to a tested head 1 with the initial magnetic domain structure shown on the left, the stress is then removed, and the magnetic domain structure changes as shown on the right.

Also, by inverting the principle of the present invention, the present invention can be used as a method of detecting that the magnetization angle θ of a testing apparatus is not correctly set at 0° if variation in output voltage occurs when a master head (an MR head for which variations in output voltage occur only when minute angle magnetization is carried out) is set in the testing apparatus and the head output voltage is measured using the method of testing that uses normal magnetization.

What is claimed is:

1. A method of quality-testing a shield film of a magnetoresistive effect head that applies an external magnetic field to the magnetoresistive effect head as external stress, measures the output voltage of the magnetoresistive effect head, and repeats the applying of the external magnetic field and the measuring a plurality of times to test the quality of the shield film of the magnetoresistive effect head, wherein the magnetic field is applied in a direction parallel to the shield film of the magnetoresistive effect head and at an angle with respect to a direction perpendicular to a floating surface of the magnetoresistive effect head, and the intensity of the applied magnetic field is lower than the coercive force of a hard bias film and higher than the coercive force of the shield film.

2. The method according to claim 1, wherein the angle is in a range of 5 to 10°, inclusive.

3. The method according to claim 2, wherein the intensity of the external magnetic field is in a range of 1500 to 5000 gauss, inclusive.

4. The method according to claim 1, wherein the intensity of the external magnetic field is in a range of 1500 to 5000 gauss, inclusive.

* * * * *